United States Patent
Albin et al.

(10) Patent No.: US 10,304,989 B2
(45) Date of Patent: May 28, 2019

(54) FABRICATION AND USE OF LARGE-GRAIN TEMPLATES FOR EPITAXIAL DEPOSITION OF SEMICONDUCTOR MATERIALS

(71) Applicant: Alliance for Sustainable Energy, LLC, Golden, CO (US)

(72) Inventors: David Scott Albin, Denver, CO (US); Wyatt Keith Metzger, Louisville, CO (US); James Michael Burst, Lakewood, CO (US); Eric Michael Colegrove, Denver, CO (US); Joel Nathan Duenow, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 15/923,307

(22) Filed: Mar. 16, 2018

(65) Prior Publication Data
US 2018/0277708 A1    Sep. 27, 2018

Related U.S. Application Data

(60) Provisional application No. 62/472,657, filed on Mar. 17, 2017.

(51) Int. Cl.
*H01L 31/18* (2006.01)
*H01L 21/02* (2006.01)

(52) U.S. Cl.
CPC ...... *H01L 31/1828* (2013.01); *H01L 21/0248* (2013.01); *H01L 21/02422* (2013.01); *H01L 21/02491* (2013.01); *H01L 21/02502* (2013.01); *H01L 21/02513* (2013.01); *H01L 21/02562* (2013.01); *H01L 21/02595* (2013.01); *H01L 21/02631* (2013.01); *H01L 21/02634* (2013.01); *H01L 21/02694* (2013.01);
(Continued)

(58) Field of Classification Search
CPC ......... H01L 21/02562; H01L 21/02631; H01L 21/02502; H01L 21/02694; H01L 31/1828; H01L 31/1836; H01L 31/1864
See application file for complete search history.

(56) References Cited

U.S. PATENT DOCUMENTS 8,835,212 B2    9/2014    Avachat
10,134,590 B2 *  11/2018  Burst ............... H01L 21/02433
(Continued)

OTHER PUBLICATIONS

M.A. Cousins et al "Grain structure of CdTe in Css-deposited CdTe/CdS solar cells", Thin Solid Films, 361-362 (2000) pp. 253-257.*
(Continued)

*Primary Examiner* — Caridad Everhart
(74) *Attorney, Agent, or Firm* — Sam J. Barkley; Suzanne C. Walts

(57) ABSTRACT

Methods for growing and using large-grain templates are provided. According to an aspect of the invention, a method includes depositing a small-grain layer of a semiconductor material; treating the small-grain layer such that the small-grain layer becomes a large-grain layer; and growing an epitaxial layer of the semiconductor material on the large-grain layer. A ratio of an average grain size of the small-grain layer to a thickness of the small-grain layer is less than 1.0, and a ratio of an average grain size of the large-grain layer to a thickness of the large-grain layer is greater than 1.5.

17 Claims, 5 Drawing Sheets

"superstrate template"

FIG. 1B

"substrate template"

(52) U.S. Cl.
CPC ...... *H01L 31/1836* (2013.01); *H01L 31/1864* (2013.01); *H01L 31/1868* (2013.01)

(56) References Cited

U.S. PATENT DOCUMENTS

| | | | |
|---|---|---|---|
| 2011/0265865 A1* | 11/2011 | Korevaar | H01L 31/022425 136/255 |
| 2013/0312824 A1 | 11/2013 | Christensen et al. | |
| 2014/0083505 A1 | 3/2014 | Albin et al. | |
| 2014/0134786 A1 | 5/2014 | Gessert et al. | |
| 2014/0261685 A1 | 9/2014 | Liao et al. | |
| 2014/0261688 A1 | 9/2014 | Allenic et al. | |

OTHER PUBLICATIONS

J.D. Major et al "Control of grain size in sublimation grown CdTe and improvement in performance of devices with systematically increased grain size" Solar Energy Material & Solar Cells, 94 (2010) pp. 1107-1112.*

H.R. Moutinho et al "Investigation of polycrylstalline CdTe thin films deposited by vapor deposition, close-spaced sublimation, and sputtering" J. Vac. Sci. Tech. A13 (1995) pp. 2877-2883.*

Alamri, "The growth of CdTe thin film by close space sublimation system," Physica Status Solidi (a), vol. 200, No. 2, 2003, pp. 352-360.

Burst et al., "CdTe solar cells with open-circuit voltage breaking the 1V barrier," Nature Energy, vol. 1, Mar. 2016, pp. 1-7.

Diaz et al., "Selective CdTe Nanoheteroepitaxial Growth on Si(100) Substrates Using the Close-Spaced Sublimation Technique Without the Use of a Mask," Journal of Electronic Materials, Mar. 14, 2013, 9 pages.

Escobedo, "Investigation of CdTe (111) Epitaxial Growth Via Close-Space Sublimation," Ph.D. Thesis Presented to the Faculty of the Graduate School of the University of Texas at El Paso, Department of Electrical and Computer Engineering, May 2008, 122 pages.

Escobedo et al., "Characterization of Smooth CdTe(111) Films by the Conventional Close-Spaced Sublimation Technique," Journal of Electronic Materials, vol. 39, No. 4, 2010; pp. 400-409.

Gao et al., "One-step fast deposition of thick epitaxial CdZnTe film on (001)GaAs by close-spaced sublimation," Crystal Engineering Communication, vol. 14, 2012, pp. 1790-1794.

Jiang et al., "Hetero-epitaxial crystal growth of CdTe on GaAs substrates," Journal of Crystal Growth, vol. 310, 2008, pp. 1652-1656.

Jiang et al., "Close-spaced sublimation growth of homo- and hetero-epitaxial CdTe thick films," Journal of Crystal Growth, vol. 310, 2008, pp. 1664-1668.

Liu et al., "The Growth Model of CdTe Thin Film by Close Spaced Sublimation," IEEE Photovoltaic Specialist Conference, Jun. 14-19, 2015, pp. 1-5.

Moutinho et al., "Investigation of induced recrystallization and stress in close-spaced sublimated and radio-frequency magnetron sputtered CdTe thin films," Journal of Vacuum Science and Technology A, vol. 17, No. 4, Jul./Aug. 1999, pp. 1793-1798.

Noda et al., "Bulk Growth of CdZnTe/CdTe Crystals," Mercury Cadmium Telluride: Growth, Properties and Applications, Chapter 2, John Wiley & Sons, 2011, pp. 21-50.

Quinones, Selective CdTe Single Crystal Deposition on CdTe/Si(211) Substrates by Close Spaced Sublimation (CSS Technique), abstract only, 1 page.

Rudolph et al., "Distribution and genesis of inclusions in CdTe and (Cd,Zn)Te single crystals grown by the Bridgman method and by the travelling heater method," Journal of Crystal Growth, vol. 147, 1995, pp. 297-304.

* cited by examiner

"superstrate template"

"substrate template"

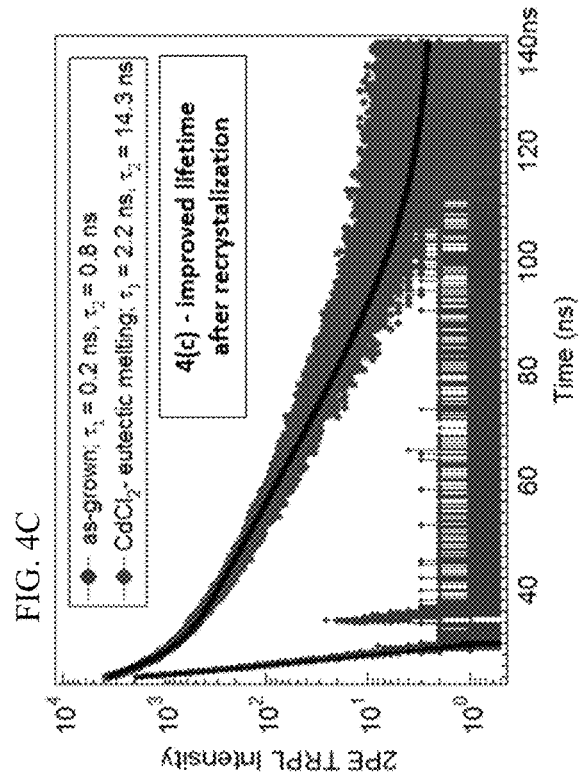
FIG. 4C
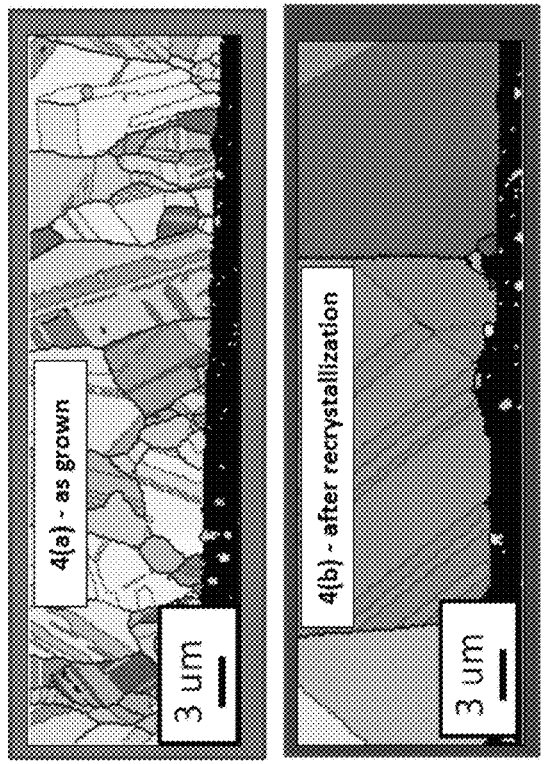
FIG. 4A
FIG. 4B

FABRICATION AND USE OF LARGE-GRAIN TEMPLATES FOR EPITAXIAL DEPOSITION OF SEMICONDUCTOR MATERIALS

CROSS-REFERENCE TO RELATED APPLICATION

This application claims priority from U.S. Provisional Application No. 62/472,657, filed Mar. 17, 2017, the disclosure of which is incorporated herein by reference in its entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

The present invention relates to large-grain templates that can be used as growth surfaces for depositing semiconductor thin films. In general, the performance of electronic devices using semiconductor thin films is improved by increasing the minority carrier lifetime and/or the majority carrier lifetime. In conventional solar cells, for instance, performance is determined mostly by the minority carrier lifetime. The carrier lifetime is reduced whenever there are regions in the solar cell where minority carriers can recombine with majority carriers. This negative effect on device performance is called recombination.

In electronic devices, including solar cells, recombination occurs where the perfection of the semiconductor's crystalline lattice is disrupted. These disruptions can be a point, a line, or a surface defect, where surface defects have the most deleterious effect on carrier lifetime. Surface defects are present in all electronic devices, and include both free-surface defects on the external surface of the material, as well as defects on surfaces internal to the material, such as grain boundaries.

The highest carrier lifetimes are measured in single-crystal semiconductors, where there are no internal surfaces (grain boundaries) and very few point or line defects. In contrast, polycrystalline materials, such as those found in traditional thin film solar cells based on CdTe and CIGS, have much smaller lifetimes due to the large grain boundary surface area and high recombination at the grain boundaries.

There are two ways to reduce recombination and increase lifetime in any polycrystalline semiconductor structure. One method involves chemical treatments to passivate grain boundary surfaces and reduce their ability to support recombination. For CdTe materials, cadmium chloride ($CdCl_2$) is commonly used to passivate grain boundaries. Although advantageous in reducing grain boundary recombination, this treatment can introduce other problems, such as majority carrier compensation and increasing point defect recombination (i.e., increasing trap states).

Another method is to increase the grain size without introducing additional point and line defects, since this has the effect of reducing the surface area available for recombination. The grain size of polycrystalline thin films produced by vapor deposition (i.e., condensation of solid films from vapors transported to a supporting growth surface or substrate, sometimes referred to as physical vapor deposition) is directly dependent on the vapor deposition conditions. For example, higher substrate temperatures and lower vapor impingement rates will increase the grain size of films deposited by physical vapor deposition. In addition, the microstructural condition of the substrate itself can impact the grain size. Substrates that introduce less strain into the growing CdTe film will result in larger CdTe grains. For instance, the largest grain CdTe thin films result from epitaxy using single-crystal substrates. If the substrate is CdTe, the process is referred to as homoepitaxy. If the substrate is not CdTe, but rather a lattice-matched and different material, the process is called heteroepitaxy. The largest grain CdTe thin films are deposited using molecular beam epitaxy (MBE) and single crystal substrates, as well as very high vacuum and low deposition rates.

Single-crystal CdTe films produced by MBE may be used as templates for homoepitaxy of CdTe, even under very high vapor impingement (e.g., deposition rate), which is present during deposition by methods such as close-spaced sublimation (CSS) and vapor transport deposition (VTD). For some applications where the substrate cost is not prohibitive, this approach greatly reduces the cost of depositing the overlying or overlayer semiconductor layer. However, the use of MBE to fabricate an intermediate template layer for the subsequent high rate deposition of CdTe (or other semiconductor materials) is likely to be cost-prohibitive for solar cell module manufacturing. Accordingly, it would be advantageous to provide a lower-cost method of fabricating a template that can be used as a growth surface for semiconductor thin films, such as CdTe.

SUMMARY

Exemplary embodiments of the invention provide methods for growing and using large-grain templates. According to an aspect of the invention, a method includes depositing a small-grain layer of a semiconductor material; treating the small-grain layer such that the small-grain layer becomes a large-grain layer; and growing an epitaxial layer of the semiconductor material on the large-grain layer. A ratio of an average grain size of the small-grain layer to a thickness of the small-grain layer is less than 1.0, and a ratio of an average grain size of the large-grain layer to a thickness of the large-grain layer is greater than 1.5. The ratio of the average grain size of the small-grain layer to the thickness of the small-grain layer may be less than 0.5, and the ratio of the average grain size of the large-grain layer to the thickness of the large-grain layer may be greater than 2.0.

The small-grain layer may be deposited onto an n-type semiconductor material within a superstrate structure. Alternatively, the small-grain layer may be deposited onto a metal film within a substrate structure. The depositing of the small-grain layer may include reducing an oxide from a deposition surface, and subsequently depositing the small-grain layer on the deposition surface by close-spaced sublimation (CSS) or vapor transport deposition (VTD).

The increasing of the grain size of the small-grain layer may include heating the small-grain layer in the presence of $CdCl_2$. The small-grain layer may be heated in the presence of oxygen and a ballast gas, and a ratio of a pressure of the oxygen to a pressure of the ballast gas may be less than 1/3. During the heating of the small-grain layer, a temperature of the small-grain layer may be greater than a temperature of a source of the $CdCl_2$.

Alternatively, the small-grain layer may be heated in the presence of oxygen and a ballast gas, and a ratio of a pressure of the oxygen to a pressure of the ballast gas may be between 0.8 and 2.0. During the heating of the small-grain layer, a temperature of the small-grain layer may be equal to a temperature of a source of the $CdCl_2$. A capping layer including oxychloride may be formed on the small-grain layer, and the increasing of the grain size of the small-grain layer may also include annealing the small-grain layer and the capping layer. The capping layer may be removed before growing the epitaxial layer on the large-grain layer.

The epitaxial layer may be grown by close-spaced sublimation (CSS) or vapor transport deposition (VTD). The epitaxial layer may be doped.

Before depositing the small-grain layer, a surface on which the small-grain layer will be deposited may be treated to increase a surface energy of the surface. Treating the surface may include an ion beam treatment and/or an application of a high surface energy additive having a low segregation coefficient in the semiconductor material. Alternatively, treating the surface may include using a hydrogen-reduction thermal treatment.

Other objects, advantages, and novel features of the present invention will become apparent from the following detailed description of the invention when considered in conjunction with the accompanying drawings.

BRIEF DESCRIPTION OF THE DRAWINGS

FIGS. 4A, 4B and 4C depict electron back scatter diffraction (EBSD) patterns of a CdTe film in cross-section view before and after $CdCl_2$ recrystallization, along with the improvement in carrier lifetime.

DETAILED DESCRIPTION

Exemplary embodiments of the present invention provide methods for making large-grain growth templates for CdTe solar cells. For example, the average grain size may be greater than twice the thickness of the film. When combined with subsequent high rate homoepitaxy using physical vapor deposition techniques such as VTD or CSS, the net result is a solar cell device structure with significantly enhanced grain size and lifetime, but made with inexpensive deposition techniques.

For CdTe solar cells, the large-grain growth template may be used in a superstrate structure or a substrate structure. Superstrate structures require that the substrate and the CdTe template be transparent to sunlight. There are no such constraints on the optical properties of the substrate and the CdTe template for substrate structures.

Figure 1A:
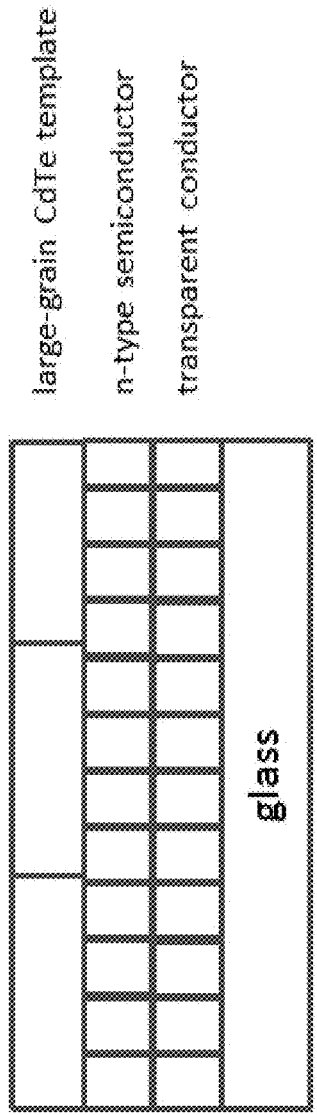
FIGS. 1A and 1B depict a large-grain template for growing CdTe solar cells in a superstrate structure and a substrate structure.
Figure 1B:
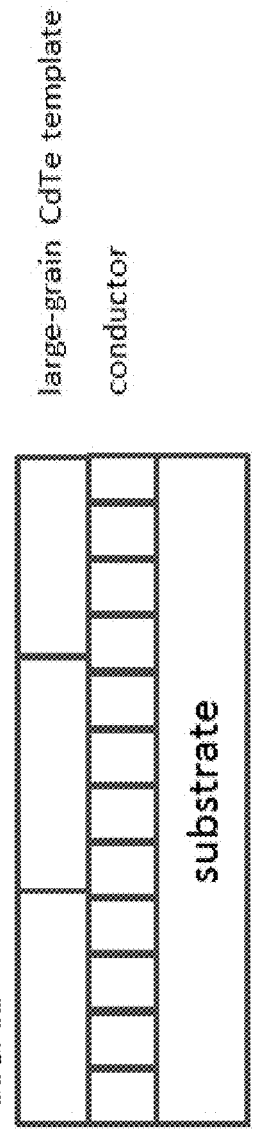

FIG. 1 shows examples of superstrate and substrate structures into which the large-grain growth template may be incorporated. The substrate structure shown at the bottom of FIG. 1 has several advantages. First, it can incorporate any type of substrate, as long as the substrate can be coated with an electrical conductor, or can perform as a conductor itself. For example, a combination of the substrate and the conductor can consist of only a metal foil. Another advantage of the substrate structure is that metal surfaces have a fundamentally higher surface energy than either n-type semiconductors or transparent (oxide) semiconductors, which greatly improves the ability to form large-grain CdTe templates by the process that will be described shortly. Finally, the process to form large-grain CdTe templates can cause considerable weakening of the template/n-type semiconductor interface leading to delamination. However, this delamination does not occur for the substrate structure.

According to exemplary embodiments of the present invention, the process for forming the growth template layer may include two steps: a small-grain deposition step, followed by a grain growth initiation step. During the small-grain deposition step, a very small-grain size CdTe layer may be deposited onto an n-type semiconductor (e.g. CdS or the like) within a superstrate structure, or onto a conductor, such as a metal film (e.g., Mo or the like), within a substrate structure at high deposition rates. The layers providing these deposition surfaces are shown in FIG. 1.

Before depositing the small-grain CdTe layer, the deposition surface may be treated in order to increase the surface energy of the deposition surface. This increases adhesion and film density during subsequent processes where CdTe grain growth occurs, which is discussed in further detail below. For example, the surface energy of metallic surfaces may be increased by removing surface oxides via hydrogen-reduction thermal treatments. Other ways to increase the surface energy may include ion beam treatments and/or the use of high surface energy additives (i.e., metals) that have a low segregation coefficient in CdTe (and thus will segregate to and affect surface properties).

One exemplary embodiment of the present invention uses a CSS-based approach to perform the small-grain deposition step. In one example, a Mo-coated glass substrate is inverted (Mo-side down) and suspended over a graphite crucible containing CdTe powder. In this example, the crucible is preferably not coated, because carbon can help in the subsequent reduction process. The crucible and the substrate are placed in a CSS system, where heat can be applied to either the crucible or the substrate independently. In an oxide reduction step, both the crucible and the substrate are heated to a temperature between 200° C. and 400° C., such as 300° C., in an atmosphere of pure hydrogen at 50-100 Torr for 10-30 minutes. The purpose of this step is to getter oxides from the Mo surface, thus greatly increasing the surface energy of the Mo surface. Other oxide reducing processes may also be used. For example, hydrazine will remove oxides, although this may be more dangerous.

After the oxide reduction step, the chamber is flushed with nitrogen in an attempt to remove all traces of hydrogen. The chamber is then filled with an inert gas like nitrogen or helium to a working pressure between 2 Torr and 50 Torr, such as about 8 Torr. The CdTe-containing crucible is then heated up as quickly as possible to provide fast deposition rates. For example, the small-grain CdTe layer may be deposited between 1 μm/min and 2 μm/sec. The crucible may be heated from 300° C. to 700° C. in about 3.5 minutes, which is a heating rate of approximately 115° C./m. It may also be possible to use faster heating rates. During this time, the substrate is not directly heated, but rises in temperature due to its close proximity to the CdTe source. After the crucible reaches a set point temperature of 700° C., it may be held at the set point temperature for about 1 minute, or whatever time is necessary to deposit approximately 1-3 microns (or less) of CdTe. During this time, the substrate may reach a temperature of about 450° C. to about 470° C., even though it is not directly heated.

Low substrate temperatures, such as between 450° C. and 470° C., result in smaller-grained films, which lead to larger-grain films after the grain growth initiation step discussed below. These low substrate temperatures also increase the sticking coefficient of CdTe, leading to a higher incorporation rate of CdTe, which results in more uniform and denser coatings. As discussed above, these low substrate temperatures may be achieved by not directly heating the substrate during deposition of the small-grain CdTe layer. Further, it may be advantageous to use faster deposition rates and lower substrate temperatures, because the goal of this step is to deposit a very small-grain and dense CdTe film. For example, as an alternative to CSS, higher deposition rate VTD-based processes or processes that are performed at room temperature, such as electrodeposition, may be used for the small-grain deposition step. In some embodiments, the ratio of the average grain size of the small-grain CdTe layer to the thickness of the small-grain CdTe layer may be less than 1.0. In other embodiments, this ratio may be less than 0.5.

$CdCl_2$-based processing may then be used for the grain growth initiation step. $CdCl_2$ acts like a flux (i.e., forms low melting eutectic phases). Other alternative approaches may also be used to initiate grain growth, such as lasers, rapid thermal processing (RTP), etc.

In one exemplary embodiment of the present invention, the grain growth initiation step is performed simply by heating the small-grain CdTe film in the presence of $CdCl_2$. The small-grain CdTe film is inverted (CdTe film side down) and suspended over a Fabmate-coated graphite crucible containing cadmium chloride ($CdCl_2$). In this example, the graphite may be coated in order to protect it from oxidation.

The film and crucible are then placed in a CSS system, where independent heating of the film and the crucible is possible. After cycle-purging the chamber for purity, the chamber is heated to approximately 200° C. and held at vacuum for about 5-10 minutes to remove moisture from the $CdCl_2$ powder. In one example, the chamber is then filled with 50 Torr oxygen and 350 Torr helium, and heated at a moderate rate (approximately 60° C./minute) to final film and $CdCl_2$ temperatures of 475° C. and 465° C., respectively, and held at this condition for 20-40 minutes, depending upon the film thickness.

The amount of oxygen present and the temperature differential between the final film and $CdCl_2$ temperatures may be adjusted. If the temperature differential is too small, a layer of oxychloride (CdCl:O) can condense on the CdTe film. Such a layer is disadvantageous in this embodiment. Accordingly, the temperature of the final film is greater than the temperature of the $CdCl_2$ by a suitable amount, such as 10° C. to 30° C. Further, it is advantageous for some oxygen be present, because grain growth is not observed if oxygen is not present. The pressure ratio of oxygen to an inert ballast gas, such as helium in this example, may be less than 1/3.

Figures 2A, 2B:
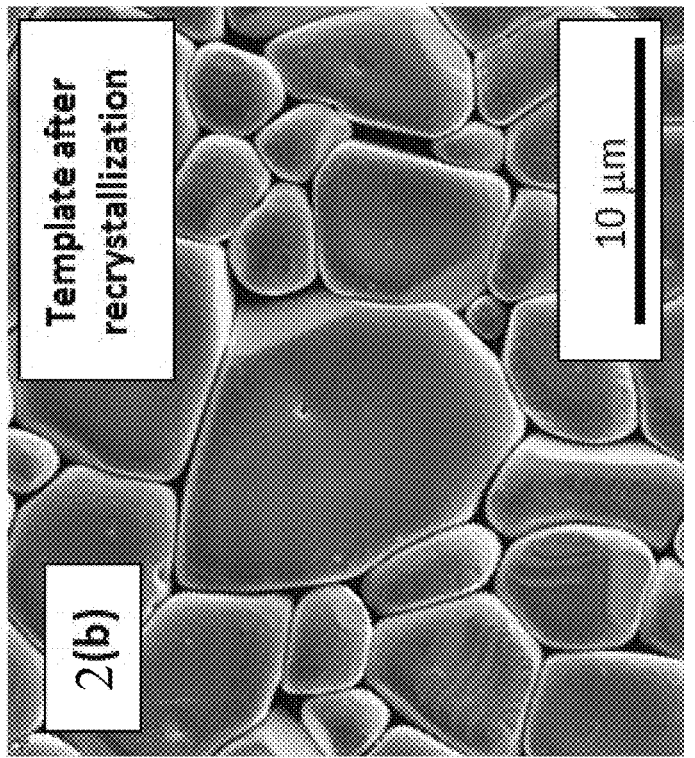
FIGS. 2A and 2B depict the transformation of a small-grain CdTe film into a large-grain template via a $CdCl_2$ treatment.

After the $CdCl_2$ treatment, the film is allowed to cool. As shown in FIG. 2, the initial small-grain film has undergone a tremendous increase in grain size. FIG. 2(a) shows the microstructure of the initial small-grain film, while FIG. 2(b) shows the microstructure of the film after the $CdCl_2$ treatment according to the present embodiment.

In another exemplary embodiment of the present invention, the grain growth initiation step is performed by heating the small-grain CdTe film in the presence of $CdCl_2$ and forming a capping layer. The small-grain CdTe film is inverted (CdTe film side down) and suspended over a Fabmate-coated graphite crucible containing cadmium chloride ($CdCl_2$). In this example, the graphite may be coated in order to protect it from oxidation.

The film and crucible are then placed in a CSS system, where independent heating of the film and the crucible is possible. After cycle-purging the chamber for purity, the chamber is heated to approximately 200° C. and held at vacuum for about 5-10 minutes to remove moisture from the $CdCl_2$ powder. The chamber is then filled with a higher proportion of oxygen: 200 Torr oxygen relative to 200 Torr helium, and may be heated at the same moderate rate (approximately 60° C./minute) to final film and $CdCl_2$ temperatures between 475° C. and 500° C. (both), and held at this condition for slightly longer times (approximately 70 minutes). Under these conditions of higher oxygen concentration, identical film and crucible ($CdCl_2$) temperatures, and longer treatment times, a capping layer of oxychloride forms on the CdTe. In this example, the pressure ratio of oxygen to the ballast gas is one. However, this ratio depends on the conditions under which the oxychloride layer is deposited. A lower ratio is suitable for lower final film temperatures, while a higher ratio is needed in order to form the oxychloride at higher final film temperatures. Accordingly, the pressure ratio of the oxygen to the ballast gas may be between 0.8 and 2.0.

Figure 3:
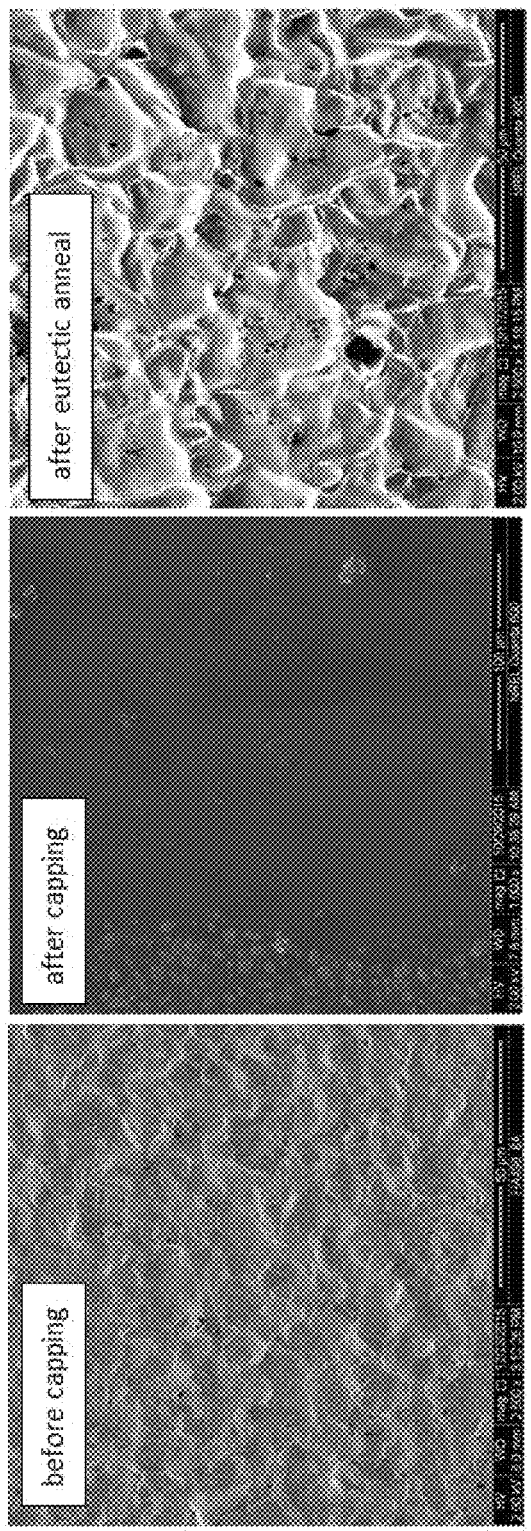
FIG. 3 depicts the transformation of a small-grain CdTe film into a large-grain template via another $CdCl_2$ treatment.

Once capped, the film is removed from the CSS reactor and annealed in the presence of hydrogen (for example, 100 Torr hydrogen and 300 Torr helium) at a temperature of 525° C. for an additional 40 minutes. $CdCl_2$ and CdTe form a eutectic at a temperature just below approximately 500° C., and the eutectic anneal temperature of 525° C. is believed to result in complete melting of the film resulting in film densification and grain growth. The film densification is evidenced by a measurable decrease in the thickness of the film. FIG. 3 shows the various stages of this second $CdCl_2$ embodiment that uses a capping layer. The capping layer may be removed after the 525° C. eutectic anneal step using an acid etch.

The net goal of both embodiments using the $CdCl_2$ treatment is to take an initial small-grain CdTe film and to treat it in such a way that larger grains result. The initial small-grain CdTe film deposition methods (i.e., CSS, VTD, electrodeposition, etc.) as well as the subsequent $CdCl_2$ treatments are relatively inexpensive. The magnitude of grain growth is increased when the grain size of the initial CdTe film is small. Thus, there is a technological advantage (in addition to a cost advantage) to using low substrate temperatures or unheated substrates when growing the initial CdTe film during the small-grain deposition step. The ratio of the average grain size of the large-grain layer to the thickness of the large-grain layer is greater than 1.5. In other embodiments, this ratio may be greater than 2.0 or 4.0.

In addition to grain growth, there are intragranular (i.e., within the grain) improvements associated with using the higher $CdCl_2$ temperatures during the grain growth initiation step. FIG. 4 shows electron back scatter diffraction (EBSD) patterns of a thicker film in cross-section view before (a) and after (b) the $CdCl_2$ treatment in the second embodiment in which the capping layer is formed. This film was made to have a thickness of approximately 10 microns to facilitate lifetime measurements without interference from the top and bottom surfaces of the film, i.e., measurements that are primarily affected by grain boundaries. Not only is there significant grain growth (and a reduction of grain boundaries perpendicular to the film plane), but the grains appear to grow in columnar fashion (which reduces grain boundaries parallel to the film plane). FIG. 4(c) shows that reducing grain boundaries results in a greatly increased lifetime as measured by the photoluminescence decay rate (time-resolved photoluminescence (TRPL)).

These templates present a growth surface unlike any prior surface used in depositing CdTe for solar cell applications. This enhanced large-grain template provides the same advantages for homoepitaxy as MBE-deposited CdTe templates, but at greatly reduced cost and significantly improved relevance to thin film CdTe solar cell module manufacturing.

Figure 5A:
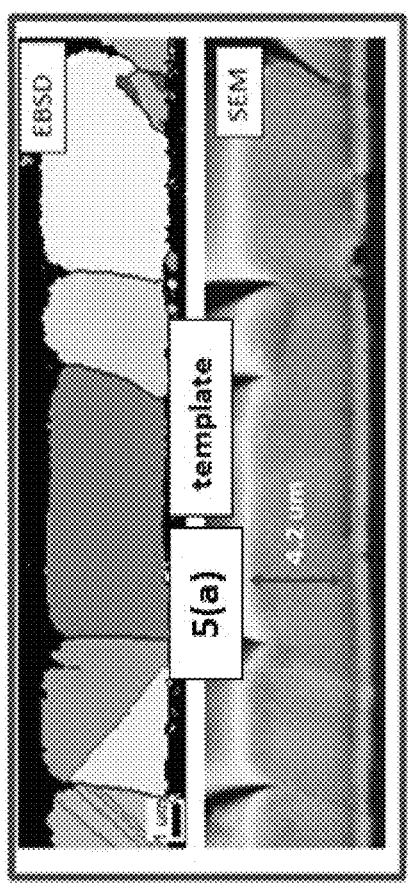
FIGS. 5A and 5B depict electron back scatter diffraction (EBSD) patterns of CdTe layers deposited epitaxially on large-grain templates.
Figure 5B:
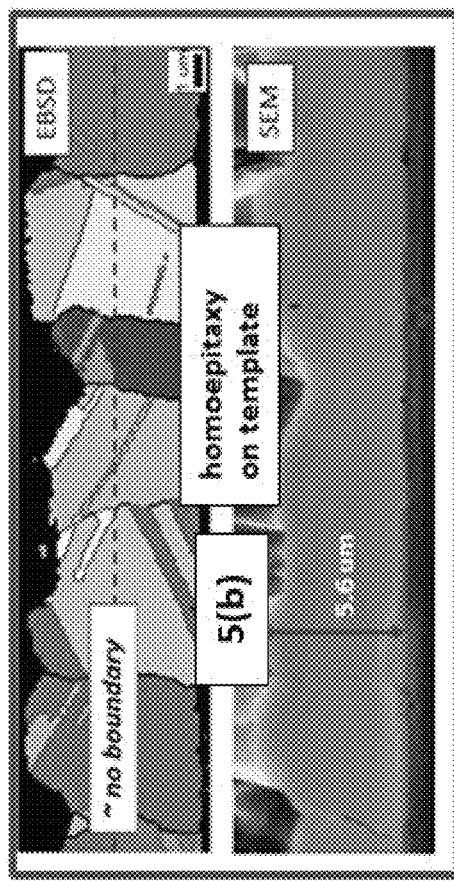

FIG. 5(a) shows a cross-section view of a somewhat thick template having an average thickness of approximately 3 microns, upon which a subsequent CdTe regrowth layer was deposited by high-rate CSS deposition, making the average final thickness approximately 6 microns. FIG. 5(b) shows the epitaxial deposition of CdTe during this latter step on the intermediate large-grain template. This type of large-grain, high lifetime structure may be incorporated into a working CdTe device by depositing appropriate n-type window layers, such as CdS or ZnO, on top of the structure.

Exemplary embodiments of the invention use the template for epitaxial growth of large-grain, high-quality CdTe at high deposition rates, such as by CSS. For example, a large-grain template formed by the methods discussed above (with grain sizes on the order of tens of microns) may be exposed to a dilute solution of hydrochloric acid and water. This removes $CdCl_2$ and CdCl:O residue. The template is then inverted (CdTe side down) and suspended over a graphite crucible containing CdTe powder. The film and the crucible are then positioned into a CSS chamber. Both the film and the crucible can be heated independently.

Next the CSS chamber is evacuated, and the film and crucible are heated to about 200° C. to remove any physisorbed moisture from either the film or the CdTe powder. At this temperature, the chamber is cycle-purged with an inert (nitrogen or helium) gas to help remove any moisture or residual contamination.

The CdTe can be deposited onto the template in a homoepitaxial manner at low or high substrate temperatures. To achieve lower substrate temperatures, the substrate is not directly heated, but is instead heated indirectly by radiation from the source material. In this case, the substrate rises to a temperature of about 450° C. to 470° C. To achieve higher substrate temperatures, intentional heat may be applied to the substrate such that its temperature reaches approximately 625° C. Both inert (nitrogen) and reducing (hydrogen) gas ambients may been used, with pressures ranging from 8 to 20 Torr. Deposition rates up to 0.1 μm/s may be used, or higher deposition rates may be used with different CSS systems.

Advantageously, the large-grain templates do not require expensive bulk crystal or MBE techniques for achieving large grains. As discussed above, the large-grain CdTe templates may be used as substrates for rapid deposition (CSS, VTD) and epitaxial growth of CdTe. The improved crystalline structure, grain size, and quality of the template are replicated in the epitaxial CdTe layer due to homoepitaxy. The net result is a solar cell device structure with significantly enhanced grain size and lifetime, but made using only inexpensive deposition processes. The epitaxial CdTe layer may be either doped or undoped. For example, the epitaxial CdTe layer may be doped by using CdTe powders that have been pre-doped with extrinsic dopants such as P, As, and/or Sb. The net result is a manufacturable process for making films with higher acceptor doping and higher lifetime, both of which are attributes recognized as necessary for advancing the CdTe thin film solar cell technology.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method comprising:
   depositing a small-grain layer of a semiconductor material;
   treating the small-grain layer such that the small-grain layer becomes a large-grain layer; and
   growing an epitaxial layer of the semiconductor material on the large-grain layer;
   wherein a ratio of an average grain size of the small-grain layer to a thickness of the small-grain layer is less than 1.0, and a ratio of an average grain size of the large-grain layer to a thickness of the large-grain layer is greater than 1.5.

2. The method according to claim 1, wherein the small-grain layer is deposited onto an n-type semiconductor material within a superstrate structure.

3. The method according to claim 1, wherein the small-grain layer is deposited onto a metal film within a substrate structure.

4. The method according to claim 1, wherein the depositing of the small-grain layer comprises:
   reducing an oxide from a deposition surface; and
   subsequently depositing the small-grain layer on the deposition surface by close-spaced sublimation (CSS) or vapor transport deposition (VTD).

5. The method according to claim 1, wherein the ratio of the average grain size of the small-grain layer to the thickness of the small-grain layer is less than 0.5, and the ratio of the average grain size of the large-grain layer to the thickness of the large-grain layer is greater than 2.0.

6. The method according to claim 1, wherein the treating of the small-grain layer comprises heating the small-grain layer in the presence of $CdCl_2$.

7. The method according to claim 6, wherein:
   the small-grain layer is heated in the presence of oxygen and a ballast gas, and a ratio of a pressure of the oxygen to a pressure of the ballast gas is less than 1/3.

8. The method according to claim 7, wherein during the heating of the small-grain layer, a temperature of the small-grain layer is greater than a temperature of a source of the $CdCl_2$.

9. The method according to claim 6, wherein the small-grain layer is heated in the presence of oxygen and a ballast gas, and a ratio of a pressure of the oxygen to a pressure of the ballast gas is between 0.8 and 2.0.

10. The method according to claim 9, wherein during the heating of the small-grain layer, a temperature of the small-grain layer is equal to a temperature of a source of the $CdCl_2$.

11. The method according to claim 9, wherein a capping layer comprising oxychloride is formed on the small-grain layer, and the treating of the small-grain layer further comprises annealing the small-grain layer and the capping layer.

12. The method according to claim 11, further comprising removing the capping layer before growing the epitaxial layer on the large-grain layer.

13. The method according to claim 1, wherein the epitaxial layer is grown by close-spaced sublimation (CSS) or vapor transport deposition (VTD).

14. The method according to claim 13, further comprising doping the epitaxial layer.

15. The method according to claim 1, further comprising, before depositing the small-grain layer, treating a surface on which the small-grain layer will be deposited to increase a surface energy of the surface.

16. The method according to claim 15, wherein the treating of the surface comprises at least one of an ion beam treatment or an application of a high surface energy additive having a low segregation coefficient in the semiconductor material.

17. The method according to claim 15, wherein the treating of the surface comprises removing oxides from the surface by using a hydrogen-reduction thermal treatment.

* * * * *